United States Patent
Callard et al.

(10) Patent No.: US 9,455,798 B2
(45) Date of Patent: Sep. 27, 2016

(54) FORWARD ERROR CORRECTION (FEC) TO SUPPORT SUCCESSIVE INTERFERENCE CANCELLATION (SIC)

(71) Applicant: Huawei Technologies Co., Ltd., Shenzhen (CN)

(72) Inventors: Aaron James Callard, Ottawa (CA); Mohammadhadi Baligh, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/970,837

(22) Filed: Dec. 16, 2015

(65) Prior Publication Data

US 2016/0105256 A1 Apr. 14, 2016

Related U.S. Application Data

(63) Continuation of application No. 13/787,554, filed on Mar. 6, 2013, now Pat. No. 9,246,514.

(51) Int. Cl.
*H03M 13/00* (2006.01)
*H04L 1/00* (2006.01)
(Continued)

(52) U.S. Cl.
CPC ............ *H04L 1/0048* (2013.01); *G06F 11/10* (2013.01); *H03M 13/1102* (2013.01); *H03M 13/1148* (2013.01); *H03M 13/29* (2013.01);
(Continued)

(58) Field of Classification Search
CPC .. H04L 1/0048; H03M 13/1148; G06F 11/10
See application file for complete search history.

(56) References Cited

U.S. PATENT DOCUMENTS

2003/0118031 A1 6/2003 Classon et al.
2008/0069074 A1* 3/2008 Shin ..................... H04B 7/0417
370/342

(Continued)

FOREIGN PATENT DOCUMENTS

WO 2009079824 A1 7/2009
WO 2011108904 A2 9/2011

OTHER PUBLICATIONS

Yu-Chuan Fang et al: "E-MBS Resource Partition for the IEEE 802.16m/D3 Amendment (16.9.1); C80216m-09_2971", IEEE Draft; C80216M-09_2971, IEEE-SA, vol. 802.16m, Dec. 31, 2009, pp. 1-6, Piscataway, NJ.

(Continued)

*Primary Examiner* — Sam Rizk
(74) *Attorney, Agent, or Firm* — Slater Matsil, LLP

(57) ABSTRACT

Forward Error Correction (FEC) techniques that generate independently decodable resource blocks are beneficial for Successive Interference Cancellation (SIC) demodulation. One FEC technique for generating independently decodable resource blocks includes mapping locally decodable FEC codeblocks into unique resource blocks such that substantially all of the bits of the FEC codeblock are carried within a single resource block. The locally decodable FEC codeblocks can be generated from different FEC encoding modules or from a common FEC encoding module. Another technique for generating independently decodable resource blocks includes encoding a stream of information bits into low-density parity-check (LDPC) codeblocks having high ratios of inward peering parity bits. These high ratios of inward peering parity bits allow substantial portions of each LDPC codeblock to be decoded independently from information carried by other LDPC codeblocks.

20 Claims, 8 Drawing Sheets

(51) Int. Cl.
  *H03M 13/11*   (2006.01)
  *H03M 13/29*   (2006.01)
  *H03M 13/35*   (2006.01)
  *H03M 13/37*   (2006.01)
  *G06F 11/10*   (2006.01)
  *H03M 13/23*   (2006.01)
  *H03M 13/27*   (2006.01)

(52) U.S. Cl.
  CPC ....... *H03M13/356* (2013.01); *H03M 13/3707* (2013.01); *H03M 13/6525* (2013.01); *H04L 1/0041* (2013.01); *H04L 1/0071* (2013.01); *H03M 13/23* (2013.01); *H03M 13/27* (2013.01); *H03M 13/2909* (2013.01); *H03M 13/2957* (2013.01)

(56) References Cited

U.S. PATENT DOCUMENTS

| | | | |
|---|---|---|---|
| 2008/0274711 A1* | 11/2008 | Heiman | H04B 1/71072 455/296 |
| 2008/0310535 A1 | 12/2008 | Kwon et al. | |
| 2009/0290544 A1 | 11/2009 | Yano et al. | |
| 2011/0161771 A1 | 6/2011 | Zheng et al. | |
| 2013/0238962 A1 | 9/2013 | Summerson et al. | |

OTHER PUBLICATIONS

Samantha R. Summerson et al: Convolutional network codes for reliable point-to-point wireless communication, Proc., Asilomar Conference on Signals, Systems and Computers, IEEE Computer Society, US, Nov. 4, 2012, p. 1918-1921.

* cited by examiner

FORWARD ERROR CORRECTION (FEC) TO SUPPORT SUCCESSIVE INTERFERENCE CANCELLATION (SIC)

This patent application is a continuation of U.S. application Ser. No. 13/787,554, filed on Mar. 6, 2013 and entitled "Forward Error Correction (FEC) to Support Successive Interference Cancellation (SIC)," which is hereby incorporated by reference herein as if reproduced in its entirety.

TECHNICAL FIELD

The present invention relates generally to wireless communications, and, in particular embodiments, to enhanced forward error correction (FEC) techniques for supporting successive interference cancellation (SIC).

BACKGROUND

Successive interference cancellation (SIC) is a technique used by receivers to decode a serving data transmission from an interference signal or channel in which the serving data transmission has collided with one or more interfering data transmissions. Specifically, the served receiver may decode (partially or fully) the interfering data, and use the decoded interfering data to isolate the serving data transmission from the interference signal. Once isolated, the serving data transmission is decoded.

Inefficiencies occur when the serving data transmission and the interfering data transmission do not overlap with one another precisely, as often happens when one data transmission begins or ends before the other data transmission. Specifically, conventional forward error correction (FEC) designs distribute FEC bits of the interfering data transmission throughout the resources used to transport the interfering data transmission. This causes served receivers attempting to perform SIC decoding to evaluate all of the resource blocks (RBs) carrying the interfering data transmission, even when some of those RBs don't carry serving data. As such, FEC designs that produce independently decodable RBs are desired to enable more efficient SIC decoding.

SUMMARY OF THE INVENTION

Technical advantages are generally achieved, by embodiments of the present invention which describe enhanced FEC techniques for supporting SIC.

In accordance with an embodiment, a method for encoding is provided. In this example, the method includes obtaining a stream of information bits, and encoding the stream of information bits into independently decodable forward error correct (FEC) codeblocks. The method further includes mapping each FEC codeblock to a unique resource block, and transmitting the FEC codeblocks as a data stream in accordance with that mapping. Accordingly, the method generates a data stream carrying independently decodable resource block, which facilitates SIC decoding for the reasons discussed herein. An apparatus for performing this method is also provided.

In accordance with another embodiment, another method of encoding is provided. In this example, the method includes obtaining a stream of information bits, and encoding the stream of information bits into low-density parity-check (LDPC) codeblocks. Each LDPC codeblock comprise parity bits of which at least twenty-five percent are inward peering parity bits, which enables a large portion of the LDPC block to be independently decoded. The method further includes mapping each LDPC codeblock to a single resource blocks, and transmitting the LDPC codeblocks as a data stream in accordance with that mapping. An apparatus for performing this method is also provided.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. Further, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification.

Figure 1:
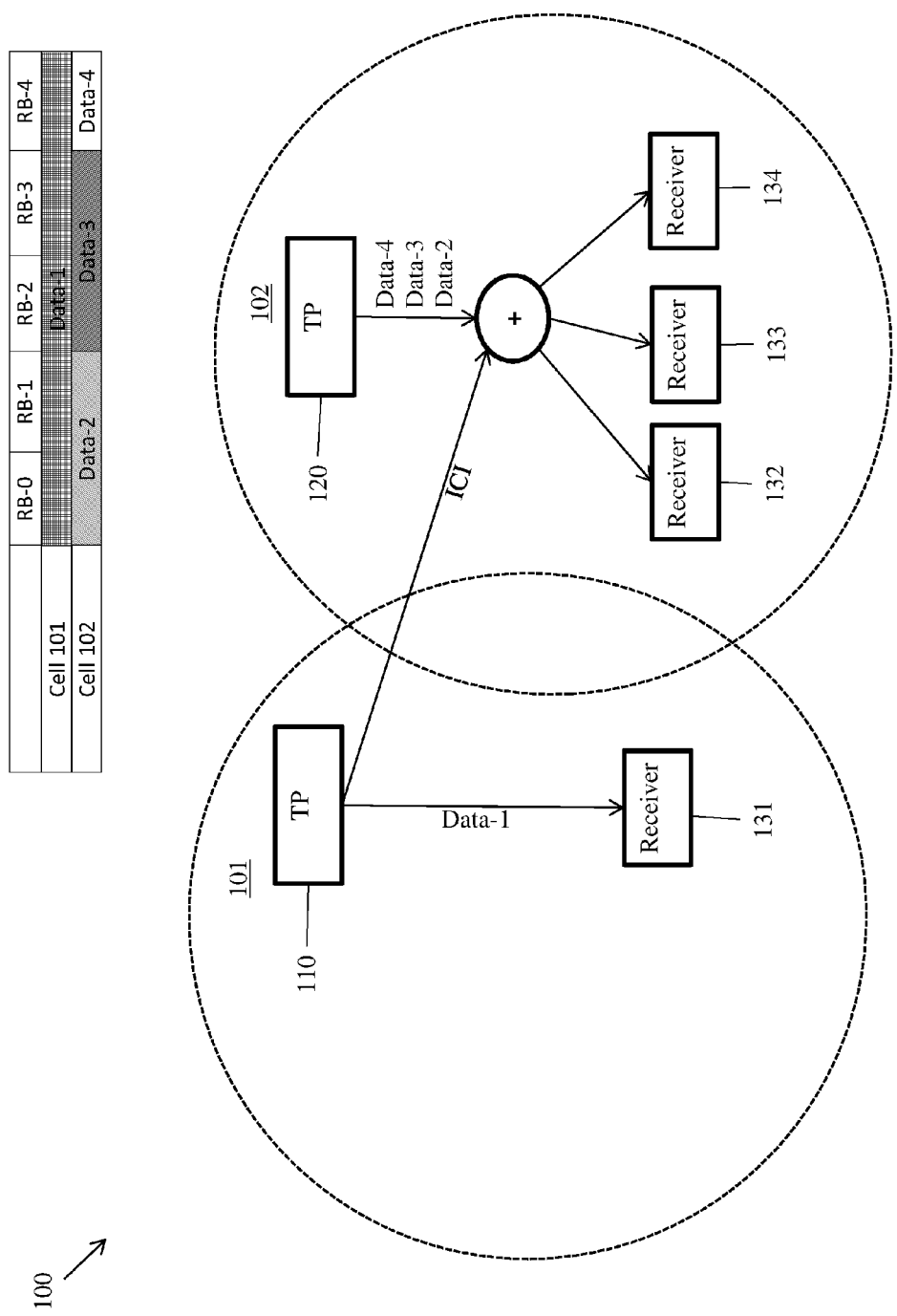
FIG. 1 illustrates a diagram of a network for communicating data.

FIG. 1 illustrates a network 100 comprising a pair of neighboring cells 101 and 102 in which a pair of transmit points (TPs) 110 and 120 (respectively) are configured to communicated data to a plurality of receivers 131-134 over common time frequency resources, namely the resource blocks (RBs) indexed zero through four (RB-0, RB-1, RB-2, RB-3 , RB-4, RB-5). As used herein, the term resource block (RB) refers to any collection of resources in any network, and should not be interpreted as exclusively referring to resource blocks (RBs) unless explicitly qualified as such. For example, resource blocks may include collections of resources in both LTE networks and non-LTE networks, such as WiMAX and other networks. Additionally, resource blocks are not limited to time and frequency resources but could also correspond to resources in the spatial domain, e.g., different transmit layers, etc. The term transmit point (TP) refers to any device capable of performing wireless transmissions, including base stations, enhanced base stations (eNBs), femtocells, user equipments (UEs), mobile terminals, relays, and other wirelessly enabled devices. For instance, TPs may be transmitters located on a terminal, base station, eNB, relay node, femtocell, or other wireless device that are configured to transmit an encoded signal. Further, the term receiver is used herein to refer to any device capable of receiving wireless signals, including base stations, eNBs, femtocells, UEs, mobile terminals, relays, and other wirelessly enabled devices. The wireless transmissions discussed herein can be any wireless transmission, including uplink, downlink, device-to-device (D2D), wireless fidelity (Wi-Fi), and other wireless transmissions.

In the cell 101, the receiver 131 is scheduled to receive a first data transmission (data-1) spanning the RB-0 through the RB-4. In the cell 102, the receiver 132 is scheduled to receive a second data transmission (data-2) spanning the RB-0 and RB-1, the receiver 133 is scheduled to receive a third data transmission (data-3) spanning the RB-2 and RB-3, and the receiver 134 is scheduled to receive a third data transmission (data-3) spanning the RB-4.

In one example, the receiver 134 is configured to decode the data-4 in the RB-4 using a SIC decoding technique. When the data-1 is encoded in accordance with conventional FEC architectures, the portion of the data-1 communicated in the RB-4 is not independently decodable. As a consequence, the receiver 134 may need to at least partially decode portions of the data-1 communicated in the RB-0, RB-1, RB-2, and RB-3. What's more, decoding these portions of the data-1 communicated in the RB-0, RB-1, RB-2, and RB-3 may require decoding the data-3 and/or data-4, depending on various communication parameters (e.g., UE ordering, etc.). Hence, conventional FEC designs may require the receiver 134 to at least partially decode the data-1, data-2, and data-3 to obtain the data-4 in accordance with a SIC decoding technique.

Figure 2:
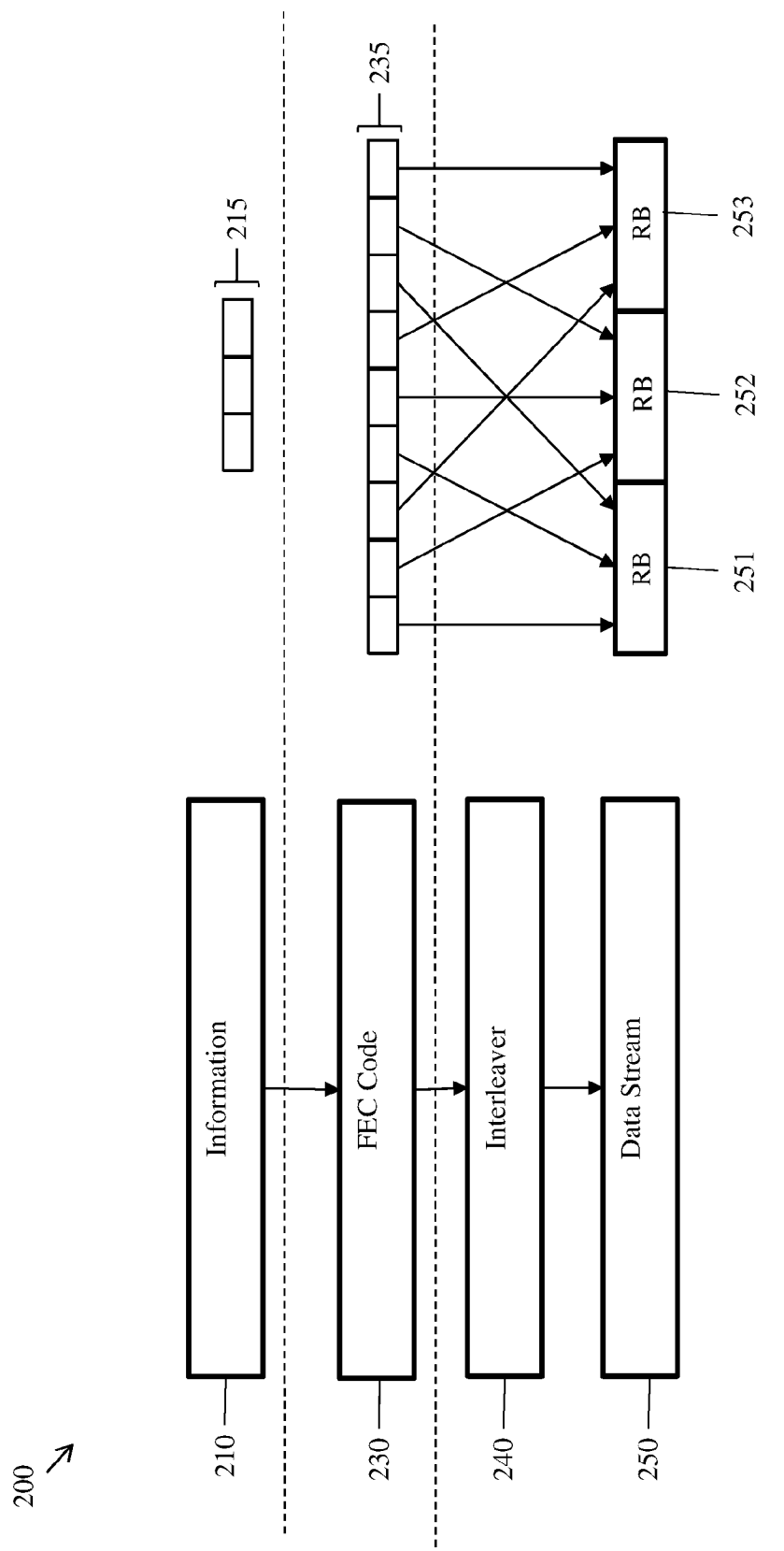
FIG. 2 illustrates a diagram of a conventional FEC architecture for encoding data.

FIG. 2 illustrates a conventional FEC architecture 200 for encoding data. The conventional FEC architecture 200 includes an information module 210, which generates or receives N information bits 215 (N is an integer). The conventional FEC architecture 200 further includes an FEC code module 230, which converts the information bits 215 into K FEC bits 235 (K is an integer greater than N). The FEC bits 235 are a function of the information bits 215, and include at least some parity bits related to the information bits 215. The conventional FEC architecture 200 further includes an interleaver module 240, which interleaves the FEC bits 235 into a data-stream 250. Notably, the interleaver module 240 intersperses the FEC bits 235 amongst a plurality of resource blocks 251-253, and, as a result, the resource blocks 251-253 are not independently decodable. In some embodiments, an interleaver may also reside between the information module 210 and the FEC code module 230. For reasons discussed above, SIC decoding suffers when resource blocks are not independently decodable, and thus improved FEC architectures are desired.

Aspects of this disclosure provide FEC designs and schemes that generate independently decodable RBs, thereby enabling more efficient SIC decoding. In some embodiments, multiple FEC coding modules are utilized to generate independently decodable resource blocks. In other embodiments, a low-density parity-check (LDPC) encoder is configured to generate resource blocks having high ratios of inner-peering parity bits (i.e., parity bits whose parity check links do not extend outside the instant resource block), thereby allowing a significant portion of those resource blocks to be decoded without referencing other resource blocks.

Figure 3:
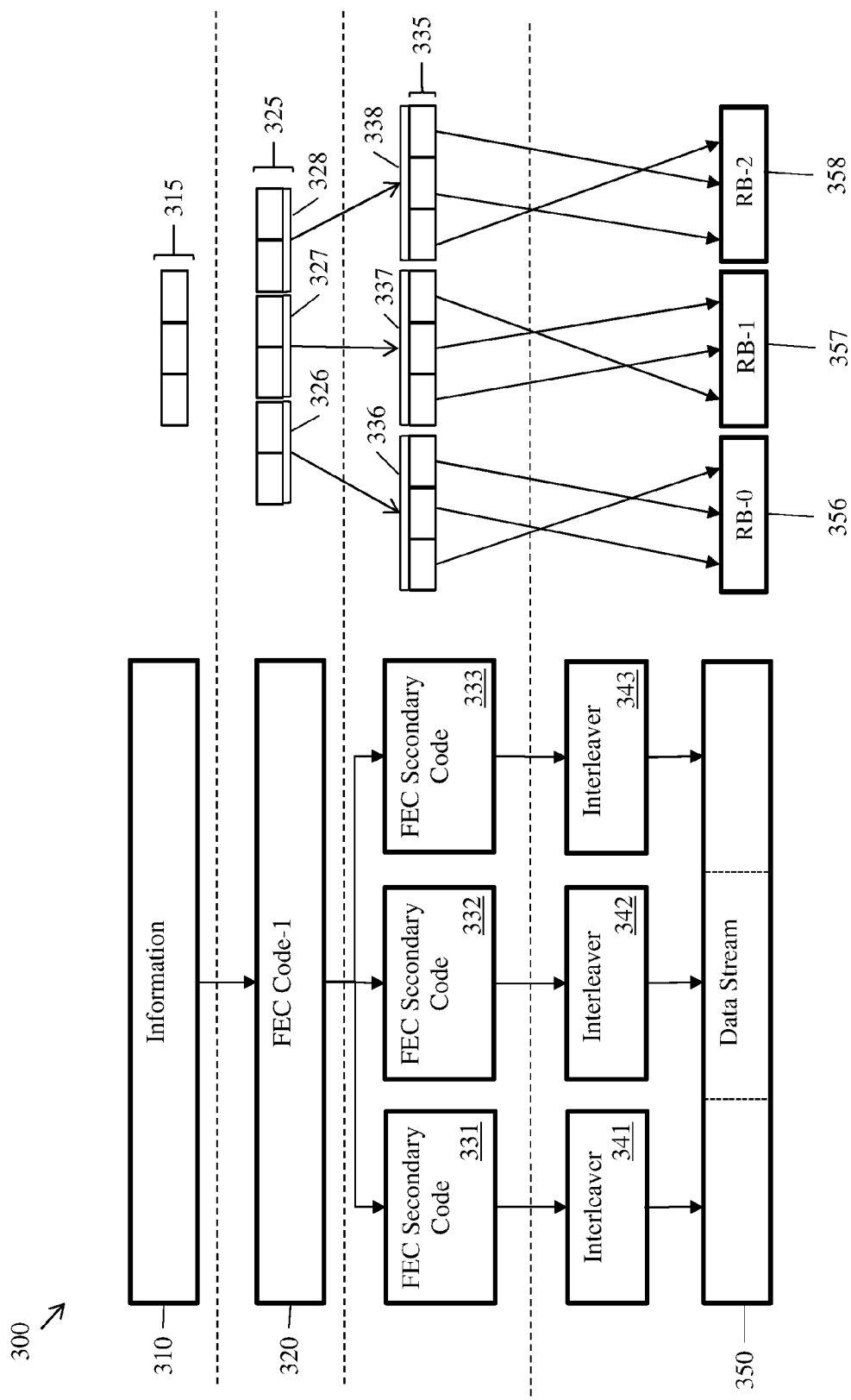
FIG. 3 illustrates a diagram of an embodiment FEC architecture for encoding data.

FIG. 3 illustrates an embodiment FEC architecture 300 for encoding data into independently decodable resource blocks. The FEC architecture 300 includes an information module 310, which generates or receives N information bits 315. The FEC architecture 300 further includes an FEC code-1 module 320, which converts the information bits 315 into M FEC bits 325 (M is an integer greater than N but less than K). The FEC code-1 module may be any FEC code, such as a convolutional code, LDPC, another product code, a block code, etc. The FEC bits 335 are a function of the information bits 315, and include at least some parity bits related to the information bits 315. The FEC architecture 300 further includes a plurality of FEC secondary code modules 331-333. Although the embodiment FEC architecture 300 is depicted as having three FEC secondary code modules 331-333, other embodiment FEC architectures may have different numbers of FEC secondary code modules (e.g., two, four, five, etc.). Further, there may exist additional interleavers (not shown) positioned between the information module 310 and the FEC code-1 module 320 and/or between the FEC code-1 module 320 and one or more of the FEC secondary code modules 331-333. In some embodiments, the FEC code-1 and one or more of the secondary codes may combine to form an FEC product code.

The FEC secondary code modules 331-333 are configured to encode a specific portion of the FEC bits 325 to generate specific portions of the FEC bits 335. Specifically, the FEC secondary code module 331 is configured to encode a first set of the FEC bits 326 to obtain the FEC bits 336, the FEC secondary code module 332 is configured to encode a second set of the FEC bits 327 to obtain the FEC bits 337, and the FEC secondary code module 333 is configured to encode a third set of the FEC bits 328 to obtain the FEC bits 338. In some embodiments, the number of FEC bits encoded by the FEC secondary code modules 331-333 may be the same, such that each set of FEC bits 326, 327, and 328 comprise an equal number of the FEC bits 325. For instance, if the FEC bits 325 include 90 bits, then each set of FEC bits 326, 327, and 328 may comprise 30 bits. In other embodiments, the number of FEC bits encoded by the FEC secondary code modules 331-333 may be different, such that at least some of the sets of FEC bits 326, 327, and 328 comprise different numbers of the FEC bits 325. For instance, if the FEC bits 325 include 90 bits, then the first set of FEC bits 326 may comprise 40 bits, the second set of FEC bits 327 may comprise 30 bits, and the third set of FEC bits 327 may comprise 20 bits. The FEC secondary code modules 331-333 may differ in other ways as well. For instance, the FEC secondary code modules 331-333 may utilize different encoding rates and/or different encoding schemes. Notably, each of the sets of FEC bits 336-338 are independently decodable such that they may be decoded without relying on information/data carried by other sets of bits. For example, the set of FEC bits 336 can be decoded without relying on information carried by the sets of FEC bits 337 and 338.

The FEC architecture 300 further includes a plurality of interleaver modules 341-343 for interleaving the FEC bits 335 into the data stream 350. More specifically, the interleaver module 341 is configured to interleave the set of FEC bits 336 into a portion of the data stream 350 corresponding to the resource block 356, the interleaver module 342 is configured to interleave the set of FEC bits 337 into a portion of the data stream 350 corresponding to the resource block 357, and the interleaver module 343 is configured to interleave the set of FEC bits 338 into a portion of the data stream 350 corresponding to the resource block 358. The resource blocks 356-358 may represent any logical set of resources. For instance, the resource blocks 356-358 may represent a set of physical resource blocks (PRBs), virtual resource blocks (VRBs), or other collections of resources. By virtue of carrying a unique set of FEC bits 336-338, each of the resource blocks 356-358 are independently decodable.

In some embodiments, the FEC code-1 320 may be a high rate code (e.g., a Block code) that provides overall performance while avoiding error floors. On the other hand, the FEC secondary code modules 331-333 may be a lower rate code (e.g., turbo code, LDPC code, convolutional code, etc.) that provides high efficiency and/or high reliability. In embodiments, different code rate options may be available for the FEC secondary code modules 331-333 (e.g., ⅓, ⅔, ⁹⁄₁₀, 1, etc.) to simplify blind detection/signaling.

Figure 4:
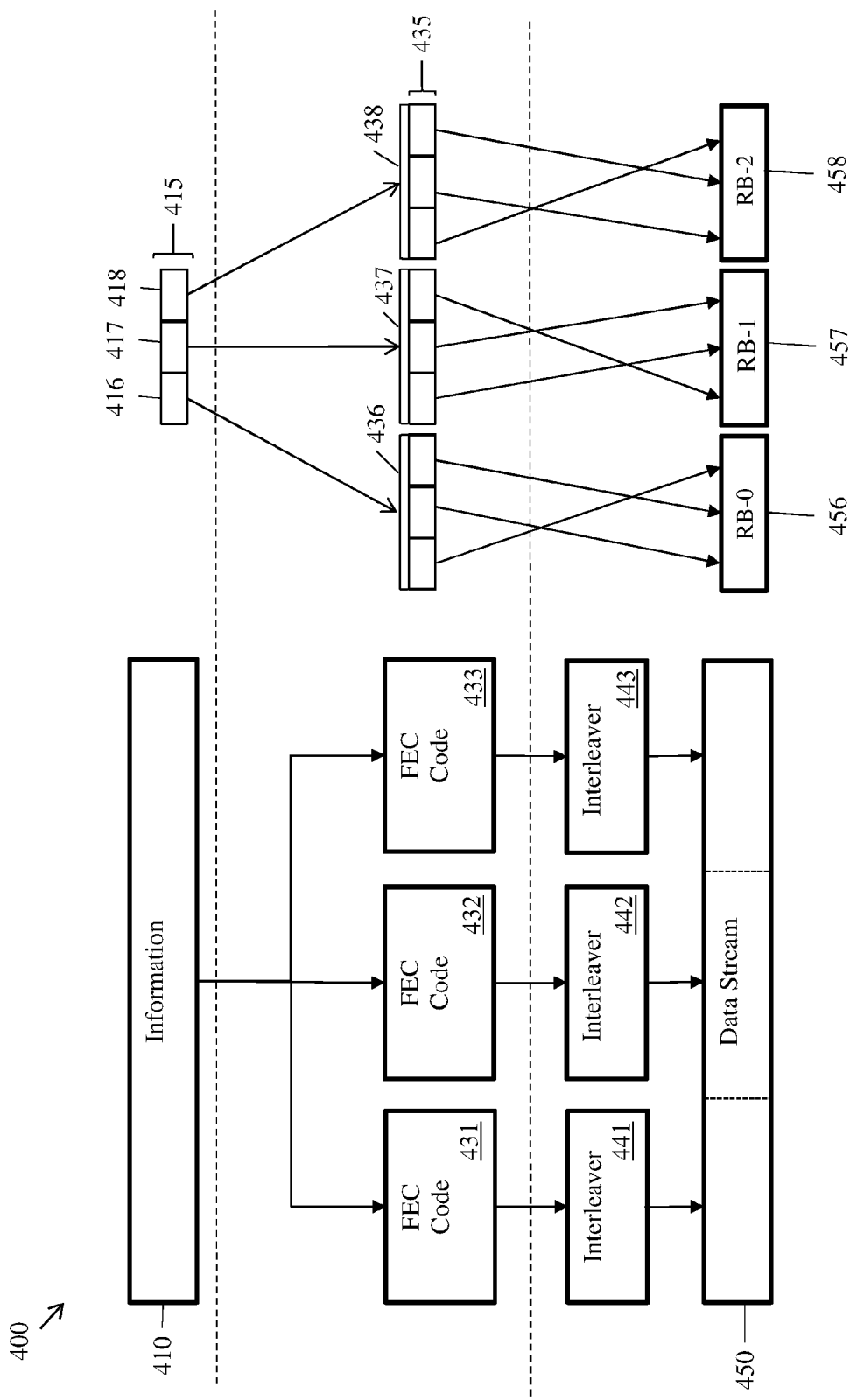
FIG. 4 illustrates a diagram of another an embodiment FEC architecture for encoding data.

Although the embodiment FEC architecture 300 depicts two layers of FEC encoding, some embodiments may include more layers, while other embodiments may include a single layer of FEC coding. FIG. 4 illustrates an embodiment FEC architecture 400 for encoding data into independently decodable resource blocks. The FEC architecture 400 is similar to the FEC architecture 300, with the exception that the FEC architecture 400 includes a single layer of FEC encoding. Specifically, the FEC architecture 400 includes an information module 410, a plurality of FEC code modules 431-433, and a plurality of interleavers 441-443. The information module 410 generates a plurality of information bits 415, the FEC code modules 431-433 encode the information bits 415 into FEC bits 435, and the interleavers 441-443 interleave the FEC bits into the data stream 450.

More specifically, the FEC code module 431 is configured to encode a first set of information bits 416 to obtain the FEC bits 436, the FEC code module 432 is configured to encode a second set of information bits 417 to obtain the FEC bits 437, and the FEC code module 433 is configured to encode a third set of information bits 418 to obtain the FEC bits 438. Further, the interleaver module 441 is configured to interleave the set of FEC bits 436 into a portion of the data stream 450 corresponding to the resource block 456, the interleaver module 442 is configured to interleave the set of FEC bits 437 into a portion of the data stream 450 corresponding to the resource block 457, and the interleaver module 443 is configured to interleave the set of FEC bits 438 into a portion of the data stream 450 corresponding to the resource block 458. Hence, each of the resource blocks 456-458 are independently decodable. The FEC code modules 431-433 may be configured similarly to one another or the differently from one another, and may utilize the same or different code rates, coding structures, etc.

Figure 5:
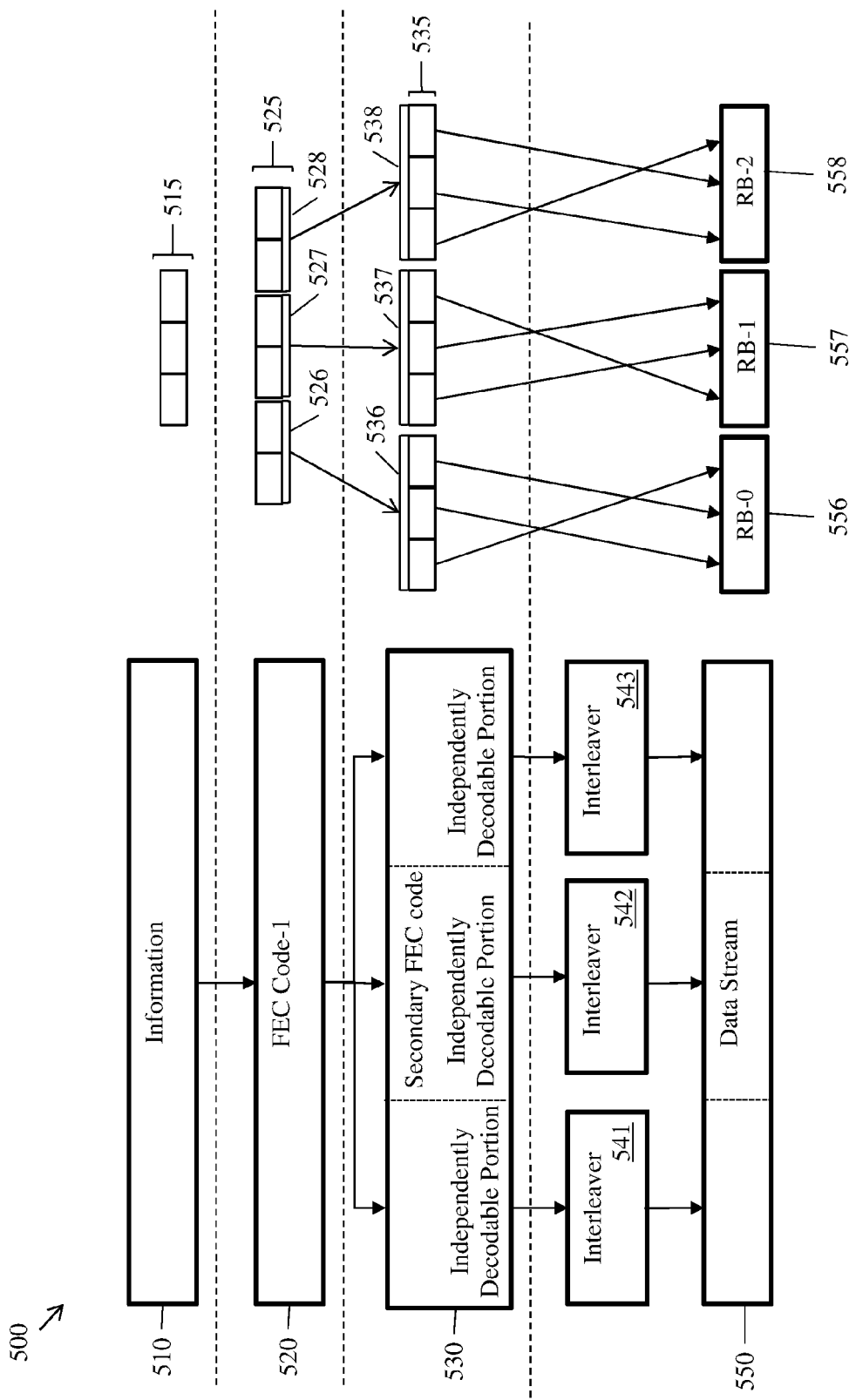
FIG. 5 illustrates a diagram of yet another an embodiment FEC architecture for encoding data.

Although the embodiment FEC architectures 300 and 400 depict separate FEC encoding modules, some embodiments may include a single FEC coding module that is configured to produce multiple, independently decodable, sets of FEC bits. FIG. 5 illustrates an embodiment FEC architecture 500 for encoding data into independently decodable resource blocks. The FEC architecture 500 is similar to the FEC architecture 300, with the exception that the FEC architecture 400 includes a single secondary FEC code module 530, rather than multiple FEC code modules. Specifically, the FEC architecture 500 includes an information module 510, an FEC code-1 520, a secondary FEC code module 530, and a plurality of interleavers 541-543. The information module 510 generates a plurality of information bits 515, and thereafter the FEC code-1 520 generates a plurality of FEC bits 525 that are a product of the information bits 515. Next, the secondary FEC code module 530 encodes the FEC bits 525 to obtain the FEC bits 535. More specifically, the secondary FEC code module 530 is configured to encode: a first set of FEC bits 526 to obtain a locally decodable set of FEC bits 536; a second set of FEC bits 527 to obtain a locally decodable set of FEC bits 537; and a third set of FEC bits 528 to obtain a locally decodable set of FEC bits 538. Thereafter, each of the locally decodable sets of FEC bits 536-538 are separately interleaved by the interleaving modules 541-543 into the data stream 550. Notably, the interleaver module 541 interleaves the locally decodable set of FEC bits 536 into a portion of the data stream 550 corresponding to the resource block 556, the interleaver module 542 interleaves the locally decodable set of FEC bits 537 into a portion of the data stream 550 corresponding to the resource block 557, and the interleaver module 543 interleaves the locally decodable set of FEC bits 538 into a portion of the data stream 550 corresponding to the resource block 558. By virtue of carrying a unique one of the locally decodable sets of FEC bits, each of the resource blocks 556-558 are independently decodable. In some embodiments, the secondary FEC code module 530 encodes the locally decodable sets of FEC bits 536-538 using the same code rate and structure. In other embodiments, the secondary FEC code module 530 encodes the locally decodable sets of FEC bits 536-538 using different code rates and/or encoding structures. In some embodiments, the FEC code-1 520 is omitted from the FEC architecture 500.

Figure 6:
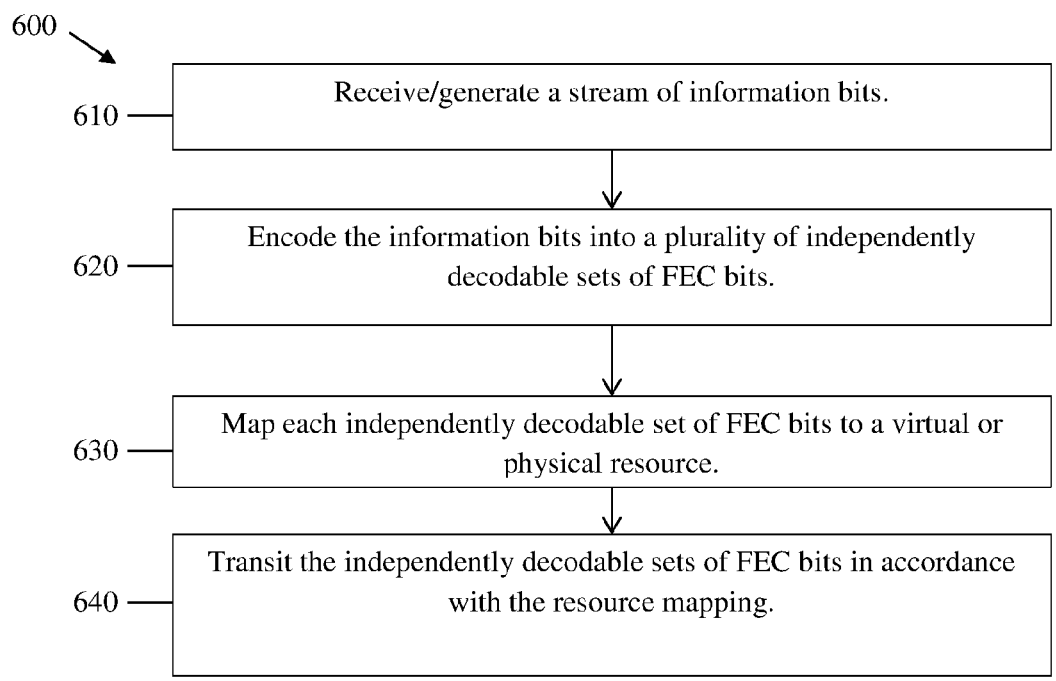
FIG. 6 illustrates a flowchart of an embodiment method for encoding data.

FIG. 6 illustrates an embodiment method 600 for encoding data into independently decodable resource blocks, as might be performed by a transmitter. The method 600 begins with step 610, where the transmitter receives (or otherwise generates) a stream of information bits. Thereafter, the method 600 proceeds to step 620, where the transmitter encodes the information bits into a plurality of independently decodable sets of FEC bits. The step 620 may include one or multiple layers of FEC coding. Next, the method 600 proceeds to step 630, where the transmitter maps each of the independently decodable sets of FEC bits to a virtual or physical resource. The step 630 may include interleaving each independently decodable set of FEC bits into an RB or collection of RBs, e.g., a PRB, a VRB, etc. Finally, the method 600 proceeds to step 640, where the transmitter transmits the independently decodable sets of FEC bits in accordance with the virtual resource mapping.

Figure 7:
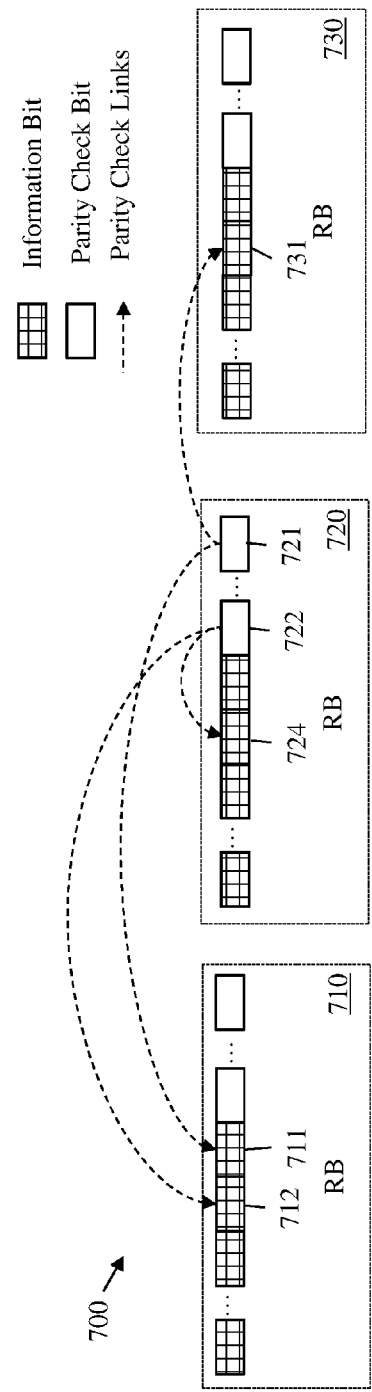
FIG. 7 illustrates a diagram of a conventional LDPC coding scheme.

Some encoding architectures (FEC or otherwise) utilize LDPC coding schemes. FIG. 7 illustrates a conventional LDPC coding scheme 700 for encoding information over a plurality of resource blocks 710-730. As shown, each of the resource blocks 710-730 comprise information bits and parity check bits. The parity check bits are either set or cleared depending on a condition of the argument bits. For instance, the parity bit 721 may be set when the argument bits 711 and 731 share the same value, or cleared when the argument bits have different values. In the conventional LDPC coding scheme 700, many of the parity bits have at least one parity check link extending outside of the instance resource block. For instance, the parity bit 721 has two parity check links extending outside the resource block 720, and therefore determining the value of the parity bit 721 may require knowing the value of the argument bit 711 and 731. Likewise, the parity bit 722 has a parity check link extending outside the resource block 720, and therefore determining the value of the parity bit 722 may require knowing the value of the argument bit 712. As such, a SIC receiver attempting to decode interfering data carried in the RB 720 may be required to decode or otherwise evaluate the RB 710 and/or the RB 730 to obtain portions of the RB 720.

Conventional LDPC schemes are designed such that the vast majority (e.g., 99 percent or more) of the parity check bits will have at least one parity check link extending outside the instant resource block. While this design characteristic allows conventional LDPC schemes to reduce average block error rates (BERs) by distributing noise across many resource blocks, it also prevents large portions of any given resource block from being independently decodable. Hence, LDPC schemes that enable more efficient SIC decoding are desired.

Figure 8:
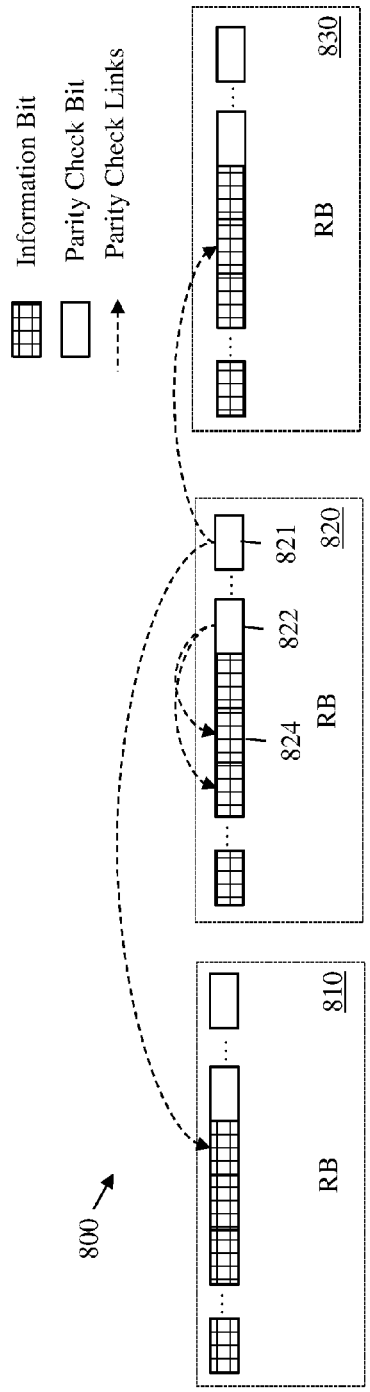
FIG. 8 illustrates a diagram of an embodiment of LDPC coding scheme.

FIG. 8 illustrates an embodiment LDPC scheme 800 for encoding information over a plurality of resource blocks 810-830. Notably, the embodiment LDPC scheme 800 comprises a higher ratio of inward peering parity bits, such as the parity bit 822, than the conventional LDPC coding scheme 700 (which typically includes fewer than one percent inward peering parity bits). The phrase inward peering parity bit is used herein to describe parity bits that can be determined without decoding or otherwise evaluating external resource blocks (i.e., RBs other than the instance RB carrying the inward peering parity bit). For instance, if all of the argument bits must be known to determine the value of the inward peering parity bit, then none of the parity check links may extend outside the instance resource block.

In the embodiment LDPC scheme 800, each of the parity check links for the parity bit 822 extend within the RB 820, which allows the value of the parity bit 822 to be determined without evaluating the external resource blocks 810/830. While the embodiment LDPC scheme 800 generates a resource blocks 820 that includes a higher ratio of inward peering parity bits than that generated by conventional LDPC schemes, it is not necessary that every parity bit is inward peering. For instance, the parity bit 821 is an outward peering parity bit. For example, the ratio of inward peering parity bits may vary depending on the needs of the system. For instance, inward peering parity bits may comprise around twenty-five percent of all parity bits for some embodiment LDPC schemes, while other embodiment LDPC schemes may generate higher ratios of inward peering parity bits (e.g., thirty-five percent, or higher). In any event, embodiment LDPC schemes will comprise substantially more inward peering parity bits than conventional LDPC schemes, which typically include fewer than one percent inward peering parity bits.

Figure 9:
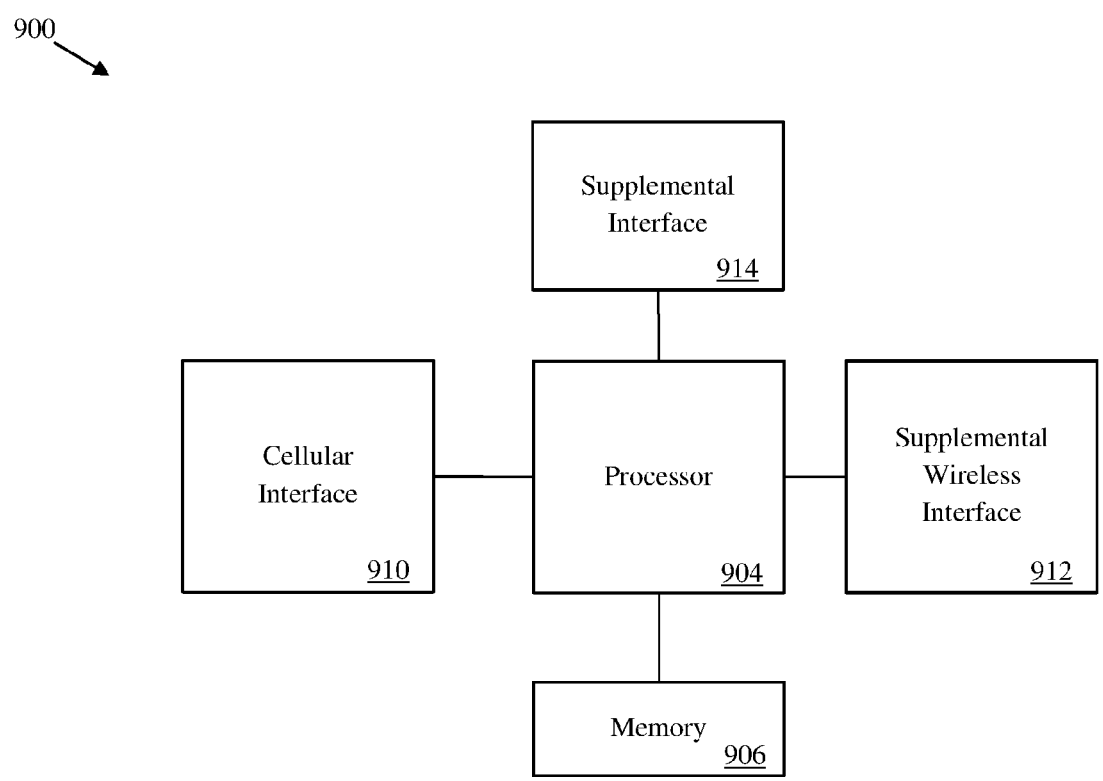
FIG. 9 illustrates a block diagram of an embodiment communications device.

FIG. 9 illustrates a block diagram of an embodiment of a communications device 900, which may be equivalent to one or more devices (e.g., UEs, NBs, etc.) discussed above. The communications device 900 may include a processor 904, a memory 906, a cellular interface 910, a supplemental wireless interface 912, and a supplemental interface 914, which may (or may not) be arranged as shown in FIG. 9. The processor 904 may be any component capable of performing computations and/or other processing related tasks, and the memory 906 may be any component capable of storing programming and/or instructions for the processor 904. The cellular interface 910 may be any component or collection of components that allows the communications device 900 to communicate using a cellular signal, and may be used to receive and/or transmit information over a cellular connection of a cellular network. The supplemental wireless interface 912 may be any component or collection of components that allows the communications device 900 to communicate via a non-cellular wireless protocol, such as a Wi-Fi or Bluetooth protocol, or a control protocol. The device 900 may use the cellular interface 910 and/or the supplemental wireless interface 912 to communicate with any wirelessly enabled component, e.g., a base station, relay, mobile device, etc. The supplemental interface 914 may be any component or collection of components that allows the communications device 900 to communicate via a supplemental protocol, including wire-line protocols. In embodiments, the supplemental interface 914 may allow the communications device 900 to communicate with another component, such as a backhaul network component.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed:

1. A method comprising:
receiving, by a served receiver, a signal carrying a serving data transmission in a first resource block assigned to the served receiver and a first portion of an interfering data transmission in the first resource block assigned to the served receiver, wherein a second portion of the interfering data transmission is communicated in a second resource block that is not assigned to the served receiver;
at least partially decoding forward error correction (FEC) codeblocks in the first portion of the interfering data transmission without decoding FEC codeblocks in the second portion of the interfering data transmission;
performing interference cancellation on the signal based on the at least partially decoded FEC codeblocks from the first portion of the interfering data transmission to partially isolate the serving data transmission from the interfering data transmission; and
decoding the serving data transmission.

2. The method of claim 1, wherein each of the FEC codeblocks in the first portion of the interfering data transmission are independently decodable.

3. The method of claim 1, wherein each of the FEC codeblocks in the first portion of the interfering data transmission are decoded using a scheme applicable to low density parity codes (LDPCs).

4. The method of claim 1, wherein each of the FEC codeblocks in the first portion of the interfering data transmission are decoded using a scheme applicable to convolutional codes.

5. The method of claim 1, wherein each of the FEC codeblocks in the first portion of the interfering data transmission are decoded using a scheme applicable to turbo codes.

6. A served receiver comprising:
a processor; and a non-transitory computer readable storage medium storing programming for execution by the processor, the programming including instructions to:

receive a signal carrying a serving data transmission in a first resource block assigned to the served receiver and a first portion of an interfering data transmission in the first resource block assigned to the served receiver, wherein a second portion of the interfering data transmission is communicated in a second resource block that is not assigned to the served receiver;

at least partially decode forward error correction (FEC) codeblocks in the first portion of the interfering data transmission without decoding FEC codeblocks in the second portion of the interfering data transmission;

perform interference cancellation on the signal based on the at least partially decoded FEC codeblocks from the first portion of the interfering data transmission to partially isolate the serving data transmission from the interfering data transmission; and decode the serving data transmission.

7. The served receiver of claim 6, wherein each of the FEC codeblocks in the first portion of the interfering data transmission are independently decodable.

8. The served receiver of claim 6, wherein each of the FEC codeblocks in the first portion of the interfering data transmission are decoded using a scheme applicable to low density parity codes (LDPCs).

9. The served receiver of claim 6, wherein each of the FEC codeblocks in the first portion of the interfering data transmission are decoded using a scheme applicable to convolutional codes.

10. The served receiver of claim 6, wherein each of the FEC codeblocks in the first portion of the interfering data transmission are decoded using a scheme applicable to turbo codes.

11. A method comprising:

receiving, by a served receiver, a signal over a first resource block and a second resource block, a portion of the signal received over the first resource block including a serving data transmission from a first node and an interfering data transmission from a second node, and a portion of the signal received over the second resource block excluding data transmissions from the first node;

partially decoding an FEC codeblock carried by the interfering data transmission received over the first resource block, the FEC codeblock being decoded independently from any data carried in the portion of the signal received over the second resource block;

performing interference cancellation on the portion of the signal received over the first resource block in accordance with the FEC codeblock to at least partially isolate the serving data transmission from the interfering data transmission; and decoding the at least partially isolated serving data transmission.

12. The method of claim 11, wherein the FEC codeblock carried by the interfering data transmission is independently decodable.

13. The method of claim 11, wherein the FEC codeblock carried by the interfering data transmission is decoded using a scheme applicable to low density parity codes (LDPCs).

14. The method of claim 11, wherein the FEC codeblock carried by the interfering data transmission is decoded using a scheme applicable to convolutional codes.

15. The method of claim 11, wherein the FEC codeblock carried by the interfering data transmission is decoded using a scheme applicable to turbo codes.

16. A served receiver comprising:

a processor; and a non-transitory computer readable storage medium storing programming for execution by the processor, the programming including instructions to:

receive a signal over a first resource block and a second resource block, a portion of the signal received over the first resource block including a serving data transmission from a first node and an interfering data transmission from a second node, and a portion of the signal received over the second resource block excluding data transmissions from the first node;

partially decode an FEC codeblock carried by the interfering data transmission received over the first resource block, the FEC codeblock being decoded independently from any data carried in the portion of the signal received over the second resource block;

perform interference cancellation on the portion of the signal received over the first resource block in accordance with the FEC codeblock to at least partially isolate the serving data transmission from the interfering data transmission; and decode the at least partially isolated serving data transmission.

17. The served receiver of claim 16, wherein the FEC codeblock carried by the interfering data transmission is independently decodable.

18. The served receiver of claim 16, wherein the FEC codeblock carried by the interfering data transmission is decoded using a scheme applicable to low density parity codes (LDPCs).

19. The served receiver of claim 16, wherein the FEC codeblock carried by the interfering data transmission is decoded using a scheme applicable to convolutional codes.

20. The served receiver of claim 16, wherein the FEC codeblock carried by the interfering data transmission is decoded using a scheme applicable to turbo codes.

* * * * *